(12) United States Patent
Kim et al.

(10) Patent No.: US 12,453,244 B2
(45) Date of Patent: Oct. 21, 2025

(54) DISPLAY DEVICE

(71) Applicant: Samsung Display Co., LTD., Yongin-si (KR)

(72) Inventors: Dong Woo Kim, Yongin-si (KR); Kyung Bae Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/768,960

(22) Filed: Jul. 10, 2024

(65) Prior Publication Data

US 2025/0126973 A1 Apr. 17, 2025

(30) Foreign Application Priority Data

Oct. 16, 2023 (KR) ........................ 10-2023-0137857

(51) Int. Cl.
*H01L 51/52* (2006.01)
*G09G 3/3233* (2016.01)
*H10K 59/121* (2023.01)

(52) U.S. Cl.
CPC ....... *H10K 59/1213* (2023.02); *G09G 3/3233* (2013.01); *G09G 2300/0408* (2013.01); *G09G 2300/043* (2013.01); *G09G 2300/0819* (2013.01); *G09G 2300/0852* (2013.01); *G09G 2300/0861* (2013.01); *G09G 2310/06* (2013.01); *G09G 2310/08* (2013.01); *G09G 2320/0233* (2013.01); *G09G 2320/0271* (2013.01); *G09G 2320/0626* (2013.01)

(58) Field of Classification Search
CPC .. H10K 59/1213; H10K 59/88; G09G 3/3233; G09G 2300/0408; G09G 2300/043; G09G 2300/0819; G09G 2300/0852; G09G 2300/0861; G09G 2310/06; G09G 2310/08; G09G 2320/0233; G09G 2320/0271; G09G 2320/0626
USPC ......................................................... 345/204
See application file for complete search history.

(56) References Cited

U.S. PATENT DOCUMENTS

| 9,351,368 | B2 | 5/2016 | Azizi et al. |
| 9,978,310 | B2 | 5/2018 | Chaji |
| 2020/0211477 | A1 | 7/2020 | Lai et al. |
| 2023/0125943 | A1* | 4/2023 | Lee ........................ H10K 59/88 345/204 |

FOREIGN PATENT DOCUMENTS

| KR | 10-0560780 | 3/2006 |
| KR | 10-0861756 | 10/2008 |
| KR | 10-2022-0049031 | 4/2022 |

* cited by examiner

*Primary Examiner* — Abdul-Samad A Adediran
(74) *Attorney, Agent, or Firm* — Sughrue Mion, PLLC

(57) ABSTRACT

A display device includes a display panel having a display area and a non-display area; a plurality of pixels disposed in the display area; a light emitting element disposed in each of the plurality of pixels; a driving transistor disposed in each of the plurality of pixels and connected to the light emitting element; and a common circuit disposed in the non-display area and connected to at least one of the driving transistor and the light emitting element of each of the plurality of pixels.

23 Claims, 11 Drawing Sheets

DISPLAY DEVICE

CROSS-REFERENCE TO RELATED APPLICATION(S)

This application claims priority to and benefits of Korean Patent Application No. 10-2023-0137857 under 35 U.S.C. 119, filed on Oct. 16, 2023, in the Korean Intellectual Property Office (KIPO), the contents of which are incorporated herein by reference.

BACKGROUND

1. Technical Field

The disclosure relates to a display device capable of implementing fine pixels.

2. Description of the Related Art

A head mounted display (HMD) is an image display device that is worn on a user's head in the form of glasses or a helmet and forms a focus at a distance close to user's eyes in front of the user's eyes. The head mounted display may implement virtual reality (VR) or augmented reality (AR).

The head mounted display magnifies and displays an image displayed by a small display device using multiple lenses. Therefore, a display device applied to the head mounted display needs to provide a high-resolution image, for example, an image having a resolution of 3000 pixels per inch (PPI) or more. To this end, an organic light emitting diode on silicon (OLEDoS), which is a small organic light emitting display device having a high resolution, has been used as the display device applied to the head mounted display. The OLEDoS is a device that displays an image by disposing organic light emitting diodes (OLEDs) on a semiconductor wafer substrate on which a complementary metal oxide semiconductor (CMOS) is disposed.

SUMMARY

Aspects of the disclosure provide a display device capable of implementing fine pixels.

According to an embodiment of the disclosure, a display device may include a display panel having a display area and a non-display area, a plurality of pixels disposed in the display area, a light emitting element disposed in each pixel, a driving transistor disposed in each of the plurality of pixels and electrically connected to the light emitting element, and a common circuit disposed in the non-display area and electrically connected to at least one of the driving transistor and the light emitting element of each of the plurality of pixels.

In an embodiment, the common circuit may be electrically connected to at least one of a drain electrode of the driving transistor and a cathode electrode of the light emitting element.

In an embodiment, the common circuit may include a first power switching circuit electrically connected to a drain electrode of the driving transistor and receiving a driving voltage, an initialization voltage, a first emission signal, and a first initialization gate signal.

In an embodiment, the first power switching circuit may include a first emission transistor electrically connected between the drain electrode of the driving transistor and a driving voltage line transmitting the driving voltage, and a first initialization transistor electrically connected between the drain electrode of the driving transistor and an initialization voltage line transmitting the initialization voltage.

In an embodiment, the first emission signal may be input to a gate electrode of the first emission transistor, and the first initialization gate signal may be input to a gate electrode of the first initialization transistor.

In an embodiment, the common circuit may further include a second power switching circuit electrically connected to a cathode electrode of the light emitting element and receiving a first common voltage, a second common voltage, and at least one of a second emission signal and a second initialization gate signal.

In an embodiment, the second power switching circuit may include a second emission transistor electrically connected between the cathode electrode of the light emitting element and a first common voltage line transmitting the first common voltage, and a second initialization transistor electrically connected between the cathode electrode of the light emitting element and a second common voltage line transmitting the second common voltage.

In an embodiment, the second emission signal may be input to a gate electrode of the second emission transistor, and the second initialization gate signal may be input to a gate electrode of the second initialization transistor.

In an embodiment, each of the plurality of pixels may include a switching transistor electrically connected between a data line and a gate electrode of the driving transistor.

In an embodiment, a write gate signal may be input to a gate electrode of the switching transistor.

In an embodiment, the display device may further include a gate driver transmitting the first emission signal, the second emission signal, the first initialization gate signal, and the second initialization gate signal to the common circuit and transmitting the write gate signal to each of the plurality of pixels.

In an embodiment, in an initialization period, the first initialization gate signal, the second initialization gate signal, and the write gate signal may each have an active level, the first emission signal and the second emission signal may each have a non-active level, and a reference voltage may be applied to the data line.

In an embodiment, in a threshold voltage detection period after the initialization period, the first emission signal, the second initialization gate signal, and the write gate signal each may have an active level, the first initialization gate signal and the second emission signal may each have a non-active level, and the reference voltage may be applied to the data line.

In an embodiment, in a data write period after the threshold voltage detection period, the first emission signal and the second initialization gate signal may each have an active level, the first initialization gate signal and the second emission signal may each have a non-active level, and a data voltage may be applied to the data line.

In an embodiment, the write gate signal may have an active level during a partial period of the data write period.

In an embodiment, in an emission period after the data write period, the first emission signal and the second emission signal may each have an active level, the first initialization gate signal, the second initialization gate signal, and the write gate signal may each have a non-active level, and the reference voltage may be applied to the data line.

In an embodiment, each of the reference voltage, the initialization voltage, the first common voltage, and the second common voltage may be a direct current (DC) voltage.

In an embodiment, the initialization voltage may be lower than or equal to the second common voltage, the initialization voltage may be lower than the reference voltage, the reference voltage may be higher than the first common voltage, the reference voltage may be higher than the sum of the initialization voltage and a threshold voltage of the driving transistor, the reference voltage may be higher than the first common voltage and lower than the driving voltage, and the driving voltage may be higher than the sum of the reference voltage and the threshold voltage of the driving transistor.

In an embodiment, each of the plurality of pixels may further include a first capacitor electrically connected between the gate electrode of the driving transistor and an anode electrode of the light emitting element, and a second capacitor electrically connected between the anode electrode of the light emitting element and the cathode electrode of the light emitting element.

In an embodiment, a ratio between capacitance of the second capacitor and capacitance of the first capacitor may be about 2:1.

In an embodiment, the second emission transistor and the second initialization transistor may be opposite types of transistors.

In an embodiment, the second emission signal may be input to a gate electrode of the second emission transistor and a gate electrode of the second initialization transistor.

In an embodiment, the common circuit may include a first power switching circuit electrically connected to a drain electrode of the driving transistor and receiving a driving voltage, an initialization voltage, a first emission signal, and a first initialization gate signal, and a cathode electrode of the light emitting element may be directly connected to a first common voltage line transmitting a first common voltage.

With a display device according to the disclosure, a plurality of pixels may share one common circuit with each other, and thus, the number of transistors required for each pixel may be reduced. Accordingly, a size of the pixels may be reduced, such that it is possible to implement fine pixels.

The effects of the disclosure are not limited to the above-described effects and other effects which are not described herein will become apparent to those skilled in the art from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
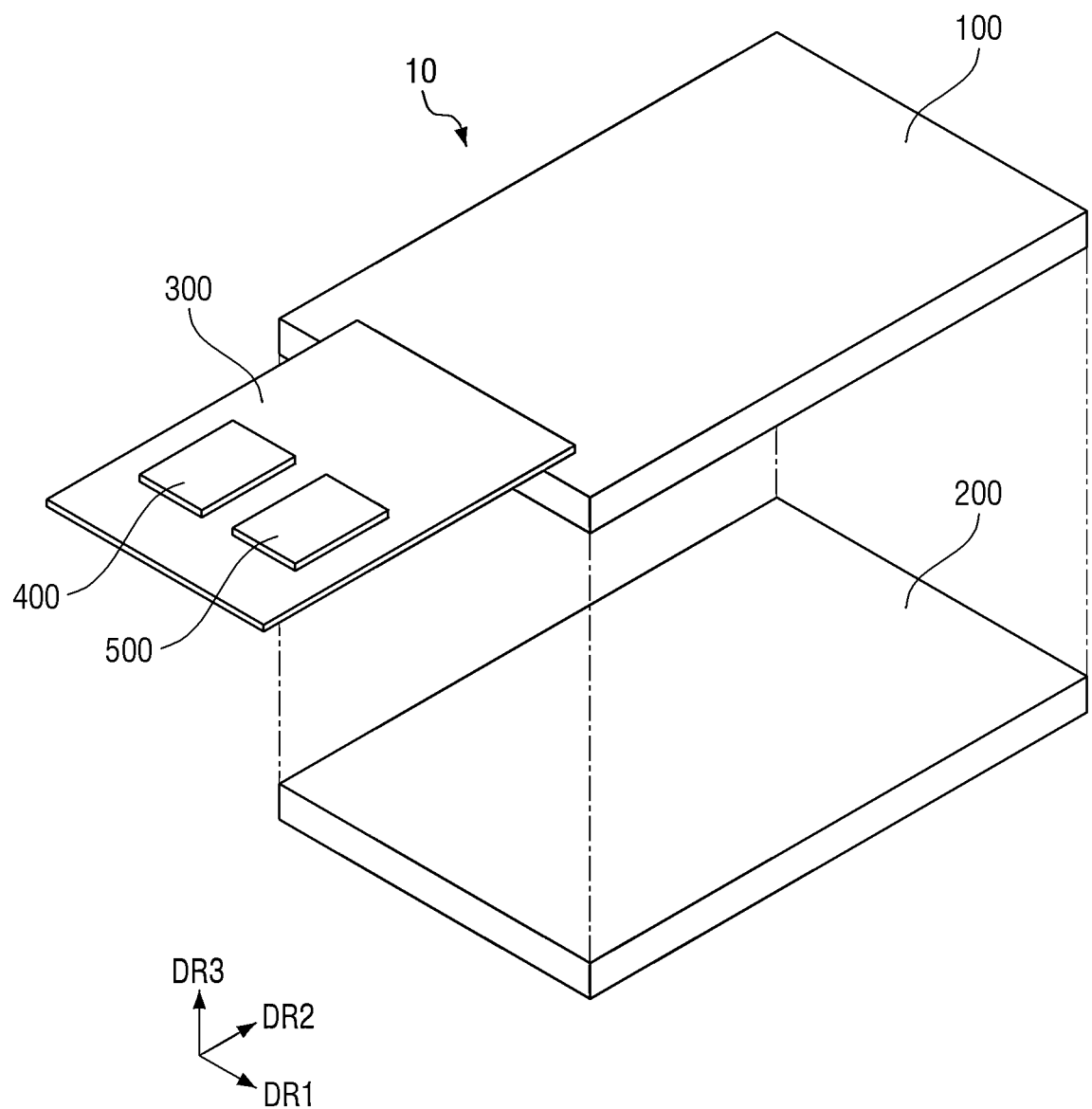
FIG. 1 is an exploded perspective view illustrating a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will fully convey the scope of the disclosure to those skilled in the art.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Features of various embodiments of the disclosure may be combined partially or totally. As will be clearly appreciated by those skilled in the art, technically various interactions and operations are possible. Various embodiments can be practiced individually or in combination.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described in detail with reference to the accompanying drawings.

Figure 2:
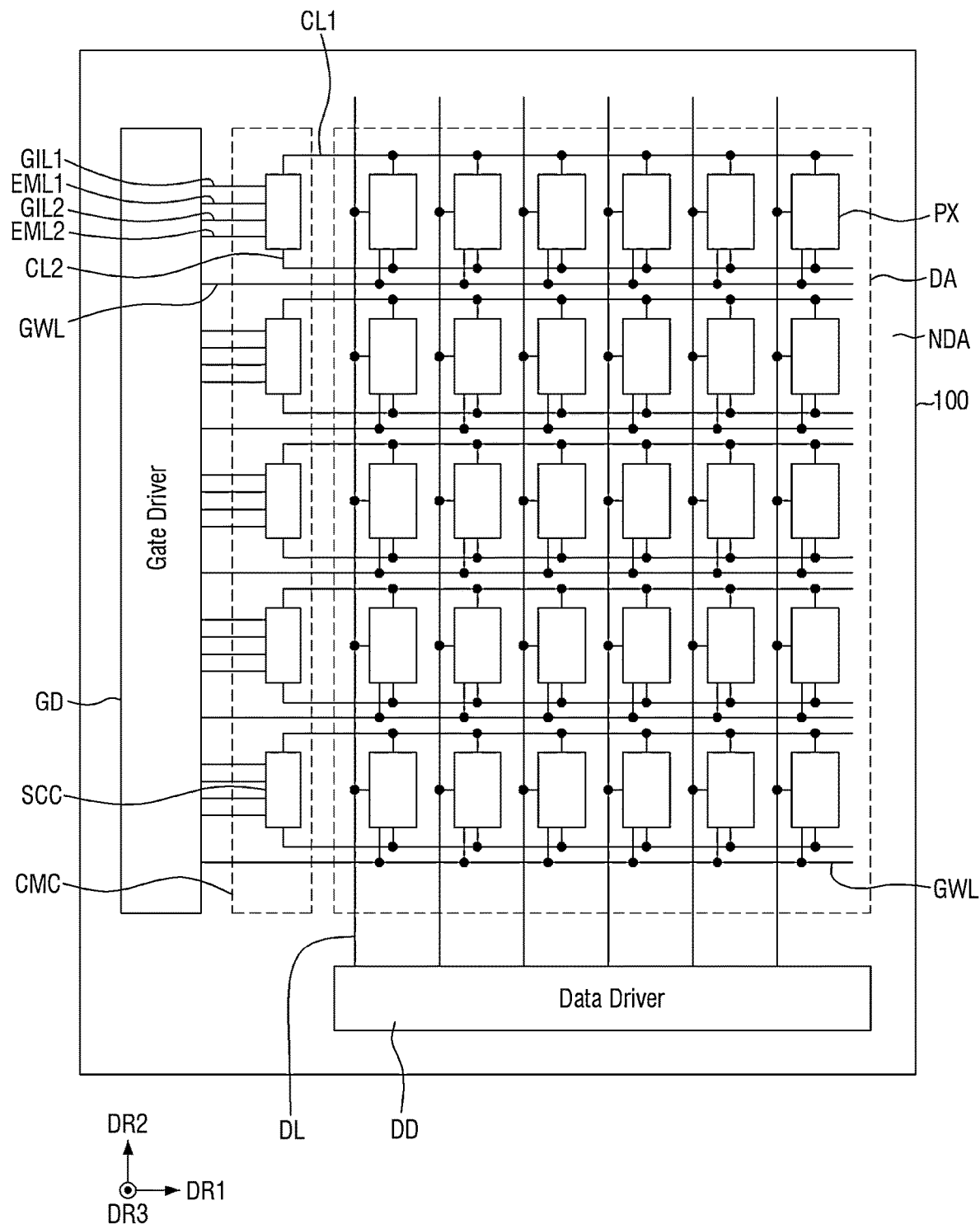
FIG. 2 is a schematic diagram illustrating a layout of a display panel illustrated in FIG. 1 according to an embodiment.

FIG. 1 is an exploded perspective view illustrating a display device 10 according to an embodiment. FIG. 2 is a schematic diagram illustrating a layout of a display panel 100 illustrated in FIG. 1 according to an embodiment.

Referring to FIGS. 1 and 2, the display device 10 according to an embodiment may be a device that displays a moving image or a still image. The display device 10 according to an embodiment may be applied to portable electronic devices such as mobile phones, smartphones, tablet personal computers (PCs), mobile communication terminals, electronic notebooks, electronic books, portable multimedia players (PMPs), navigation devices, and ultra mobile PCs (UMPCs). For example, the display device 10 may be applied as a display unit of televisions, laptop computers, monitors, billboards, or the Internet of Things (IOTs). In another embodiment, the display device 10 may be applied to smart watches, watch phones, or head mounted displays (HMDs) for realizing virtual reality and augmented reality.

The display device 10 according to an embodiment may include a display panel 100, a heat dissipation layer 200, a circuit board 300, a timing controller 400, and a power supply circuit 500.

The heat dissipation layer 200 may overlap the display panel 100 in a third direction DR3, which is a thickness direction of the display panel 100. The heat dissipation layer 200 may be disposed on a surface, for example, a rear surface, of the display panel 100. The heat dissipation layer 200 may serve to dissipate heat generated from the display panel 100. The heat dissipation layer 200 may include graphite or a metal layer made of silver (Ag), copper (Cu), or aluminum (Al) having high thermal conductivity.

The circuit board 300 may be electrically connected to multiple pads of the display panel 100 using a conductive adhesive member such as an anisotropic conductive film. The circuit board 300 may be a flexible printed circuit board or a flexible film having a flexible material. It has been illustrated in FIG. 1 that the circuit board 300 is unbent, but the disclosure is not limited thereto. In another embodiment, the circuit board 300 may be bent, and an end of the circuit board 300 may be disposed on the rear surface of the display panel 100. The end of the circuit board 300 may be an end opposite to another end of the circuit board 300 connected to the pads of the display panel 100 using the conductive adhesive member.

The timing controller 400 may receive digital video data and timing signals from the outside. The timing controller 400 may generate a gate control signal, an emission control signal, and a data control signal for controlling the display panel 100 according to the timing signals. The timing controller 400 may output the gate control signal and the emission control signal to a gate driver GD and output the digital video data and the data control signal to a data driver DD.

The power supply unit 500 may generate multiple panel driving voltages according to an external source voltage. For example, the power supply circuit 500 may generate a driving voltage, a first common voltage, a second common voltage, and an initialization voltage and supply the driving voltage, the first common voltage, the second common voltage, and the initialization voltage to the display panel 100.

Each of the timing controller 400 and the power supply unit 500 may be formed as an integrated circuit (IC) and attached to a surface of the circuit board 300. The gate control signal, the emission control signal, the digital video data, and the data control signal of the timing controller 400 may be supplied to the display panel 100 through the circuit board 300. The driving voltage, the first common voltage, the second common voltage, and the initialization voltage of the power supply circuit 500 may be supplied to the display panel 100 through the circuit board 300.

The display panel 100 may have a shape similar to a rectangular shape in plan view. For example, the display panel 100 may have a shape similar to a rectangular shape, in plan view, having short sides in a first direction DR1 and long sides in a second direction DR2 intersecting the first direction DR1. In the display panel 100, a corner where the short side in the first direction DR1 and the long side in the second direction DR2 meet may be rounded with a curvature or right-angled. The shape of the display panel 100 in plan view is not limited to the rectangular shape, and may be a shape similar to other polygonal shapes, a circular shape, or an elliptical shape. A shape of the display device 10 in plan view may follow the shape of the display panel 100 in plan view, but the disclosure is not limited thereto.

The display panel 100 may include a display area DA that displays an image and a non-display area NDA that does not display an image, as illustrated in FIG. 2.

In the display area DA of the display panel 100, multiple pixels PX, multiple write gate lines GWL, multiple first common lines CL1, multiple second common lines CL2, and multiple data lines DL may be disposed. Each of the pixels PX may include a light emitting element ED emitting light. The pixels PX may be arranged in a matrix form along the first direction DR1 and the second direction DR2 in plan view.

Each pixel PX may be connected to one write gate line GWL, one first common line CL1, one second common line CL2, and one data line DL. The write gate line GWL may extend in the first direction DR1, and pixels PX of one horizontal line arranged in an extension direction (e.g., the first direction DR1) of the write gate line GWL may be connected to the same write gate line GWL, the same first common line CL1, and the same second common line CL2. The pixels PX of the one horizontal line may be connected to different data lines DL, respectively.

In the non-display area NDA of the display panel 100, a gate driver GD, a data driver DD, a common circuit CMC, multiple first initialization gate lines GIL1, multiple second initialization gate lines GIL2, multiple first emission lines EML1, and multiple second emission lines EML2 may be disposed.

As illustrated in FIG. 2, the gate driver GD may be connected to the common circuit CMC. For example, the gate driver GD may be connected to the common circuit CMC through the first initialization gate lines GIL1, the second initialization gate lines GIL2, the first emission lines EML1, and the second emission lines EML2. The gate driver GD may generate multiple write gate signals and multiple first initialization gate signals based on the gate control signal from the timing controller 400, and generate multiple first emission signals and multiple second emission signals based on the emission control signal from the timing controller 400. The gate driver GD may supply the first initialization gate signals, the second initialization gate signals, the first emission signals, and the second emission signals to the common circuit CMC. For example, the gate driver GD may supply the first initialization gate signals to the common circuit CMC through the first initialization gate lines GIL1, supply the second initialization gate signals to the common circuit CMC through the second initialization gate lines GIL2, supply the first emission signals to the common circuit CMC through the first emission lines EML1, and supply the second emission signals to the common circuit CMC through the second emission lines EML2.

According to an embodiment, the pixels PX may share one common circuit CMC with each other, and thus, the number of transistors required for each pixel PX may be reduced. Accordingly, a size of the pixels PX may be reduced, such that it is possible to implement fine pixels.

The data driver DD may be connected to the data lines DL. The data driver DD may supply multiple data signals to the data lines DL. The data driver DD may receive the digital video data and the data control signal from the timing controller 400. The data driver DD may convert the digital video data into analog data voltages based on the data control signal from the timing controller 400 and supply the analog data voltages to the data lines DL. Pixels PX of one horizontal line may be selected by the write gate signal from the gate driver GD, and the data voltages may be supplied to the selected pixels PX. For example, the data driver DD may generate multiple data voltages based on a timing data control signal from the timing controller 400 and supply the data voltages to the data lines DL. The data driver DD may generate a reference voltage and supply the generated reference voltage to the data lines DL.

The common circuit CMC may include multiple sub-common circuits SCC. The sub-common circuits SCC may be arranged in a row in the non-display area NDA in the second direction DR2. Each sub-common circuit SCC may be connected in common to the pixels PX of the one horizontal line described above. For example, an embodiment in which the common circuit CMC includes five sub-common circuits SCC has been illustrated in FIG. 2, and in case that the five sub-common circuits SCC are defined as a first sub-common circuit SCC, a second sub-common circuit SCC, a third sub-common circuit SCC, a fourth sub-common circuit SCC, and a fifth sub-common circuit SCC in order of a reverse direction (hereinafter referred to as a second reverse direction) of the second direction DR2, the first sub-common circuit SCC may be connected in common to six pixels PX adjacent to the first sub-common circuit SCC in the first direction DR1, the second sub-common circuit SCC may be connected in common to six pixels PX adjacent to the second sub-common circuit SCC in the first direction DR1, the third sub-common circuit SCC may be connected in common to six pixels PX adjacent to the third sub-common circuit SCC in the first direction DR1, the fourth sub-common circuit SCC may be connected in common to six pixels PX adjacent to the fourth sub-common circuit SCC in the first direction DR1, and the fifth sub-common circuit SCC may be connected in common to six pixels PX adjacent to the fifth sub-common circuit SCC in the first direction DR1.

Figure 3:
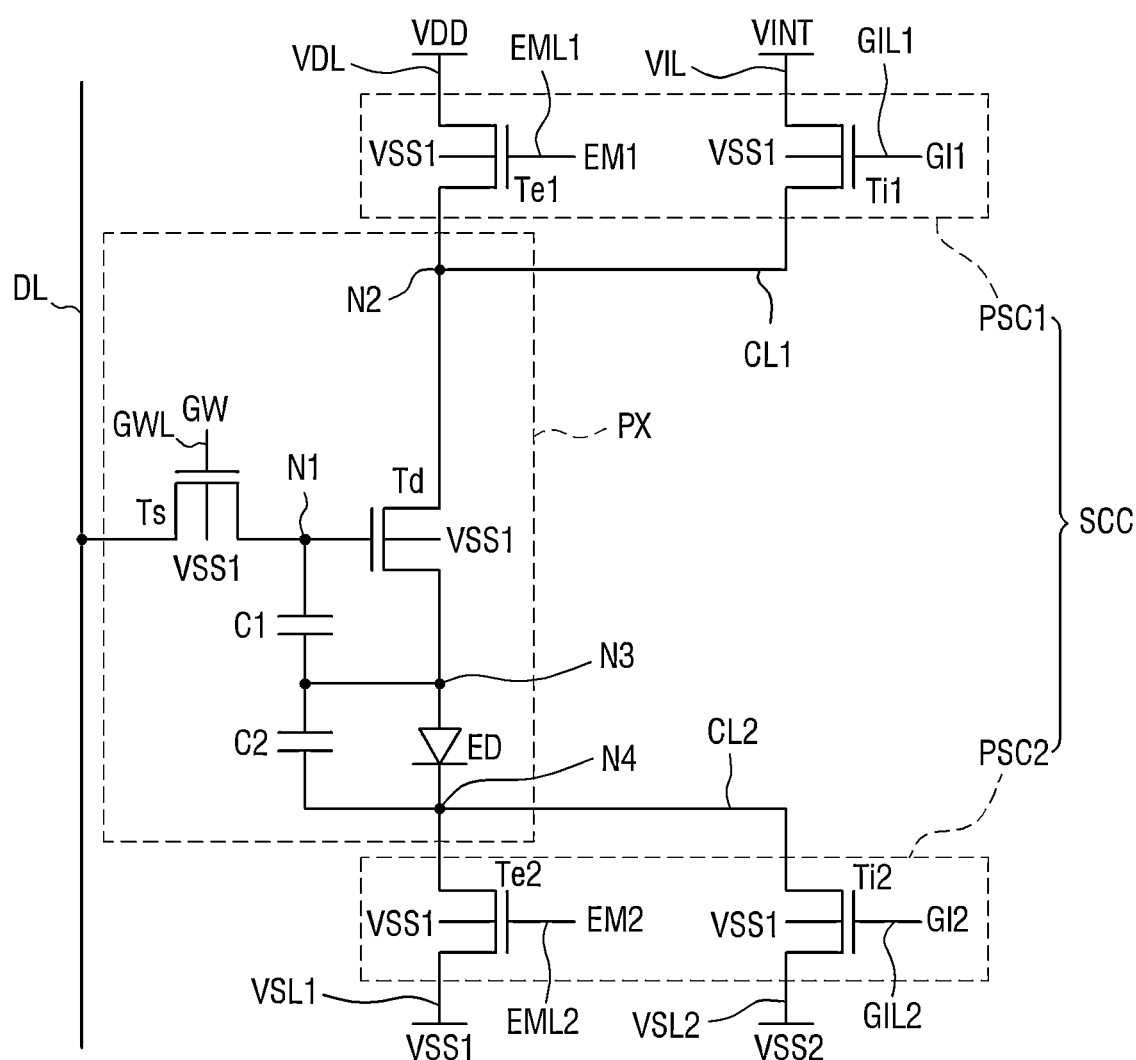
FIG. 3 is a schematic diagram of an equivalent circuit of a pixel of FIG. 2 and a sub-common circuit connected to the pixel.

FIG. 3 is a schematic diagram of an equivalent circuit of a pixel PX of FIG. 2 and a sub-common circuit SCC connected to the pixel PX.

As illustrated in FIG. 3, the pixel PX may include a driving transistor Td, a switching transistor Ts, a first capacitor C1, a second capacitor C2, and a light emitting element ED.

The driving transistor Td may include a gate electrode, a source electrode, a drain electrode, and a body electrode. The driving transistor Td may control a source-drain current (hereinafter referred to as a driving current) according to a data voltage Vdt applied to the gate electrode. The driving current flowing through a channel region of the driving transistor Td may be proportional to the square of a difference between a voltage between the source electrode and the gate electrode and a threshold voltage of the driving transistor Td. The gate electrode of the driving transistor Td may be electrically connected to a first node N1, the drain electrode of the driving transistor Td may be electrically connected to a second node N2, the source electrode of the driving transistor Td may be electrically connected to a third node N3, and the body electrode of the driving transistor Td may be electrically connected to a first common voltage line VSL1 transmitting a first common voltage VSS1.

The light emitting element ED may receive the driving current to emit light. A light emission amount or luminance of the light emitting element ED may be proportional to a magnitude of the driving current. The light emitting element ED may be an organic light emitting diode including a first electrode (e.g., an anode electrode), a second electrode (e.g., a cathode electrode), and an organic light emitting layer disposed between the first electrode and the second electrode. In another embodiment, the light emitting element ED may be an inorganic light emitting element ED including a first electrode, a second electrode, and an inorganic semiconductor disposed between the first electrode and the second electrode. In another embodiment, the light emitting element ED may be a quantum dot light emitting element ED including a first electrode, a second electrode, and a quantum dot light emitting layer disposed between the first electrode and the second electrode. In another embodiment, the light emitting element ED may be a micro light emitting diode. The first electrode of the light emitting element ED may be connected to the third node N3. The second electrode of the light emitting element ED may be connected to a fourth node N4.

The switching transistor Ts may be turned on by a write gate signal GW from a write gate line GWL to electrically connect a data line DL and the first node N1 to each other. A gate electrode of the switching transistor Ts may be electrically connected to the write gate line GWL, a drain electrode of the switching transistor Ts may be electrically connected to the data line DL, a source electrode of the switching transistor Ts may be electrically connected to the first node N1, and a body electrode of the switching transistor Ts may be electrically connected to the first common voltage line VSL1. The data line DL may transmit a data voltage or a reference voltage.

The first capacitor C1 may be electrically connected between the first node N1 and the third node N3. For example, a first electrode of the first capacitor C1 may be electrically connected to the first node N1, and a second electrode of the first capacitor C1 may be electrically connected to the third node N3.

The second capacitor C2 may be electrically connected between the third node N3 and the fourth node N4. For example, a first electrode of the second capacitor C2 may be electrically connected to the third node N3, and a second electrode of the second capacitor C2 may be electrically connected to the fourth node N4.

The sub-common circuit SCC may include a first power switching circuit PSC1 and a second power switching circuit PSC2.

The first power switching circuit PSC1 may include a first emission control transistor Te1 and a first initialization transistor Ti1.

The first emission control transistor Te1 may be turned on by a first emission signal EM1 from a first emission line EML1 to electrically connect a driving voltage line VDL and the second node N2 each other. A gate electrode of the first emission control transistor Te1 may be electrically connected to the first emission line EML1, a drain electrode of the first emission control transistor Te1 may be electrically connected to the driving voltage line VDL, a source electrode of the first emission control transistor Te1 may be electrically connected to the second node N2, and a body electrode of the first emission control transistor Te1 may be electrically connected to the first common voltage line VSL1.

The first initialization transistor Ti1 may be turned on by a first initialization gate signal GI1 from a first initialization gate line GIL1 to electrically connect the second node N2 and an initialization voltage line VIL to each other. A gate electrode of the first initialization transistor Ti1 may be electrically connected to the first initialization gate line GIL1, a drain electrode of the first initialization transistor Ti1 may be electrically connected to the second node N2, a source electrode of the first initialization transistor Ti1 may be electrically connected to the initialization voltage line VIL, and a body electrode of the first initialization transistor Ti1 may be electrically connected to the first common voltage line VSL1.

The second node N2 described above may be connected to a first common line CL1. In other words, the second node N2 of each of the pixels PX of one horizontal line may be connected in common to the first common line CL1.

The second power switching circuit PSC2 may include a second emission control transistor Te2 and a second initialization transistor Ti2.

The second emission control transistor Te2 may be turned on by a second emission signal EM2 from a second emission line EML2 to electrically connect the fourth node N4 and the first common voltage line VSL1 to each other. A gate electrode of the second emission control transistor Te2 may be electrically connected to the second emission line EML2, a drain electrode of the second emission control transistor Te2 may be electrically connected to the fourth node N4, a source electrode of the second emission control transistor Te2 may be electrically connected to the first common voltage line VSL1, and a body electrode of the second emission control transistor Te2 may be electrically connected to the first common voltage line VSL1.

The second initialization transistor Ti2 may be turned on by a second initialization gate signal GI2 from a second initialization gate line GIL2 to electrically connect the fourth node N4 and a second common voltage line VSL2 to each other. A gate electrode of the second initialization transistor Ti2 may be electrically connected to the second initialization gate line GIL2, a drain electrode of the second initialization transistor Ti2 may be electrically connected to the fourth node N4, a source electrode of the second initialization transistor Ti2 may be electrically connected to the second common voltage line VSL2, and a body electrode of the second initialization transistor Ti2 may be electrically connected to the first common voltage line VSL1.

According to an embodiment, multiple pixels PX of one horizontal line may share one sub-common circuit SCC with each other, and thus, four transistors (e.g., Te1, Te2, Ti1, and Ti2) may be removed from each pixel PX. Accordingly, a size of the pixels PX may be reduced, such that it is possible to implement fine pixels.

Figure 4:
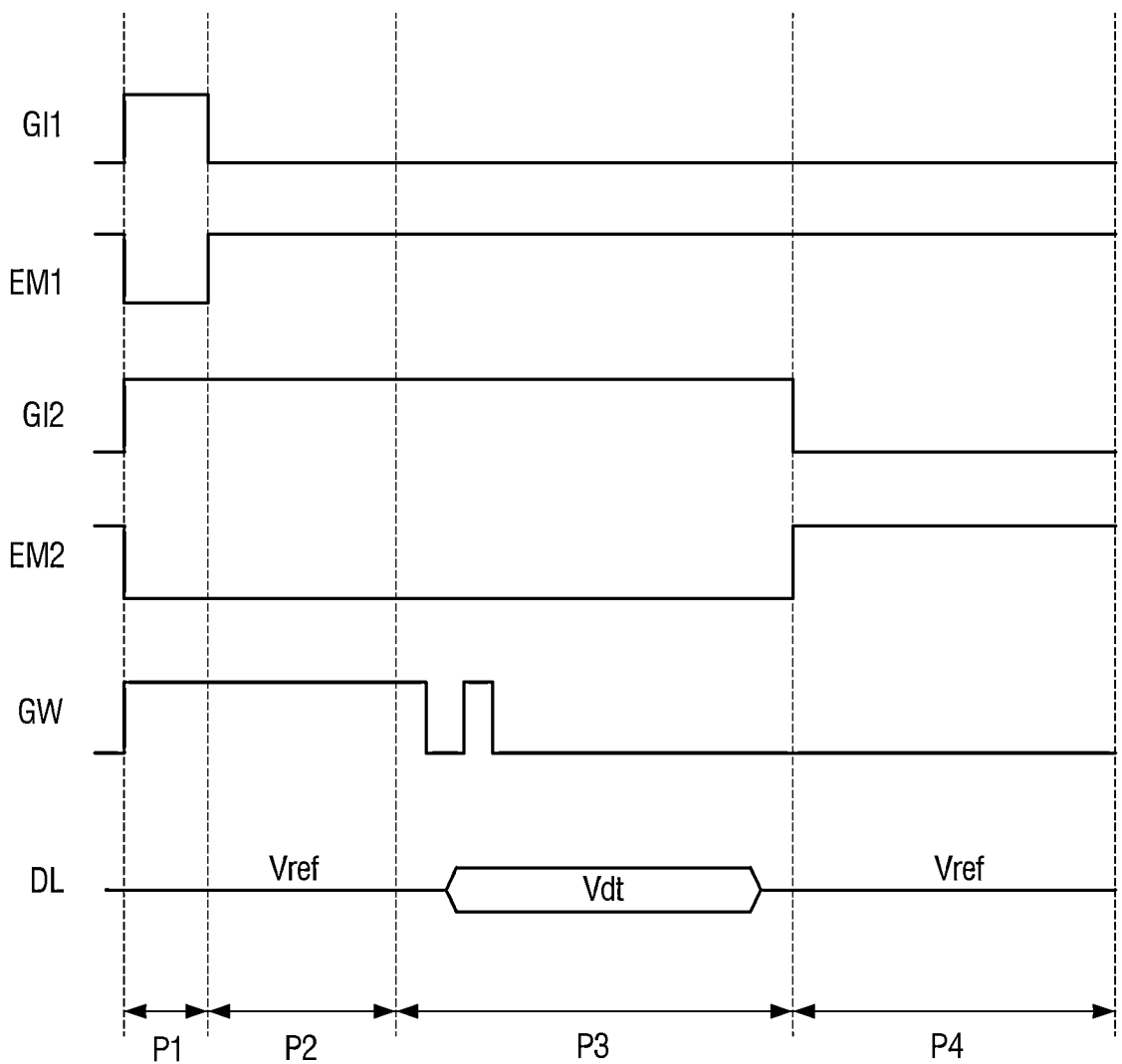
FIG. 4 is a timing chart of a first initialization gate signal, a first emission signal, a second initialization gate signal, a second emission signal, a write gate signal, a reference voltage, and a data voltage of FIG. 3.

FIG. 4 is a timing chart of a first initialization gate signal GI1, a first emission signal EM1, a second initialization gate signal GI2, a second emission signal EM2, a write gate signal GW, a reference voltage Vref, and a data voltage Vdt of FIG. 3.

The display device 10 may operate based on an initialization period P1, a threshold voltage detection period P2, a data write period P3, and an emission period P4 as in an embodiment illustrated in FIG. 4.

The first initialization gate signal GI1, the first emission signal EM1, the second initialization gate signal GI2, the second emission signal EM2, and the write gate signal GW may each have an active level or a non-active level for each period. The active level of each signal described above may be a level of a voltage that may turn on a transistor to which the corresponding signal is applied. In other words, a signal of the active level may have a value higher than a threshold voltage of the corresponding transistor. For example, as illustrated in FIG. 3, in case that each of the transistors Td, Ts, Te1, Te2, Ti1, and Ti2 is an N-type transistor, the active level of each signal may be a high level (e.g., a positive polarity level or a high voltage level).

The non-active level of each signal may be a level of a voltage that may turn off the corresponding transistor. In other words, a signal of the non-active level may have a value lower than the threshold voltage of the corresponding transistor. For example, as illustrated in FIG. 3, in case that each of the transistors Td, Ts, Te1, Te2, Ti1, and Ti2 is an N-type transistor, the non-active level of each signal may be a low level (e.g., a negative polarity level or a low voltage level).

In contrast, in case that each of the transistors Td, Ts, Te1, Te2, Ti1, and Ti2 is a P-type transistor, the active level of each signal may be a low level (e.g., a negative polarity level or a low voltage level), and the non-active level of each signal may be a high level (e.g., a positive polarity level or a high voltage level).

In the initialization period P1, the first initialization gate signal GI1, the second initialization gate signal GI2, and the write gate signal GW may each have an active level, and the first emission signal EM1 and the second emission signal EM2 may each have a non-active level. In the initialization period P1, the reference voltage Vref may be applied to the data line DL.

In the threshold voltage detection period P2, the first emission signal EM1, the second initialization gate signal GI2, and the write gate signal GW may each have an active level, and the first initialization gate signal GI1 and the second emission signal EM2 may each have a non-active level. In the threshold voltage detection period P2, the reference voltage Vref may be applied to the data line DL.

In the data write period P3, the first emission signal EM1 and the second initialization gate signal GI2 may each have an active level, and the first initialization gate signal GI1 and the second emission signal EM2 may each have a non-active level. The write gate signal GW may have an active level during a partial period (e.g., one horizontal period) of the data write period P3. The write gate signal GW may have a non-active level during the remaining period of the data write period P3 excluding one horizontal period of the data write period P3. In the data write period P3, the data voltage Vdt may be applied to the data line DL. The data voltage Vdt may be a voltage corresponding to a specific gradation (or luminance) for displaying an image.

In the emission period P4, the first emission signal EM1 and the second emission signal EM2 may each have an active level, and the first initialization gate signal GI1, the second initialization gate signal GI2, and the write gate signal GW may each have a non-active level. In the emission period P4, the reference voltage Vref may be applied to the data line DL.

Each of the above-described reference voltage Vref, initialization voltage VINT, first common voltage VSS1, and second common voltage VSS2 may be a direct current (DC) voltage.

The initialization voltage VINT may be lower than or equal to the second common voltage VSS2. The initialization voltage VINT may be lower than the reference voltage Vref.

The reference voltage Vref may be higher than the first common voltage VSS1. The reference voltage Vref may be higher than the sum of the initialization voltage VINT and the threshold voltage of the driving transistor Td. The reference voltage Vref may be higher than the first common voltage VSS1 and lower than the driving voltage VDD.

The driving voltage VDD may be higher than the sum of the reference voltage Vref and the threshold voltage of the driving transistor Td.

Figure 5:
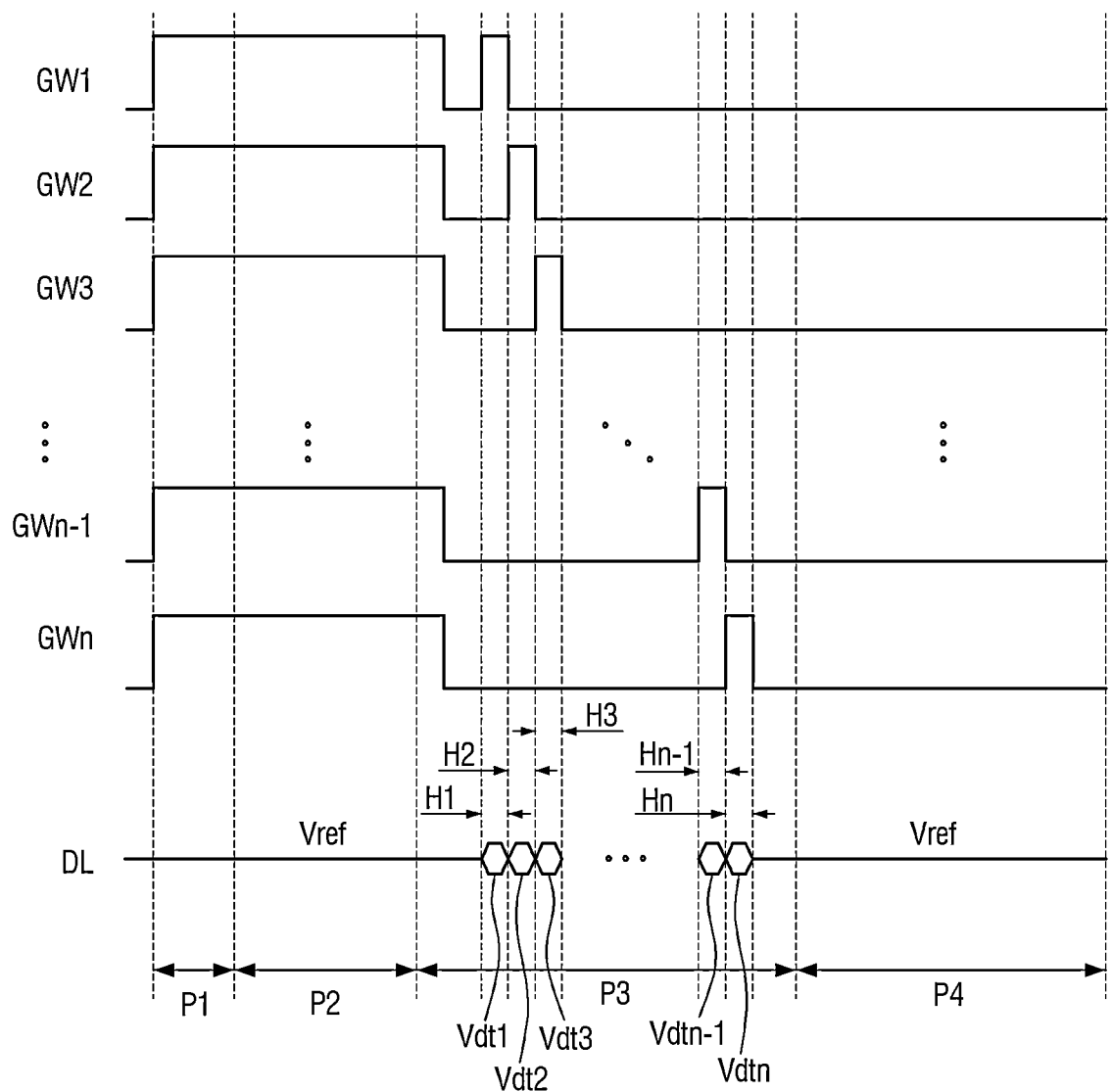
FIG. 5 is a schematic diagram for describing input timings of data voltages in a data write period of FIG. 4.

FIG. 5 is a schematic diagram for describing input timings of data voltages Vdt in a data write period P3 of FIG. 4.

As illustrated in FIG. 5, the data write period P3 may include multiple horizontal periods H1, H2, H3, ..., Hn−1, and Hn. For example, the data write period P3 may include first to n-th horizontal periods H1 to Hn.

As illustrated in FIG. 2, the display device 10 may include multiple write gate lines GWL. For example, the write gate lines GWL may include first to n-th write gate lines. n may be a natural number greater than 4. Each write gate line may be connected to pixels PX of each horizontal line. For example, the first write gate line may be connected in common to pixels PX of a first horizontal line adjacent to the first sub-common circuit SCC in the first direction DR1, the second write gate line may be connected in common to pixels PX of a second horizontal line adjacent to the second sub-common circuit SCC in the first direction DR1, the third write gate line may be connected in common to pixels PX of a third horizontal line adjacent to the third sub-common circuit SCC in the first direction DR1, ..., the n−1-th write gate line may be connected in common to pixels PX of an n−1-th horizontal line adjacent to an n−1-th sub-common circuit SCC in the first direction DR1, and the n-th write gate line may be connected in common to pixels PX of an n-th horizontal line adjacent to an n-th sub-common circuit SCC in the first direction DR1.

In the data write period P3, first to n-th write gate signals GW1, GW2, GW3, ..., GWn−1, and GWn may be sequentially applied to the first to n-th write gate lines, respectively. For example, the first to n-th write gate signals GW1, GW2, GW3, ..., GWn−1, and GWn may sequentially have an active level in accordance with the first to n-th horizontal periods H1 to Hn of the data write period P3. For example, the first write gate signal GW1 may have an active level in the first horizontal period, the second write gate signal GW2 may have an active level in the second horizontal period, the third write gate signal GW3 may have an active level in the third horizontal period, ..., the n−1-th write gate signal GWn−1 may have an active level in the n−1-th horizontal period, and the n-th write gate signal GWn may have an active level in the n-th horizontal period. In the data write period P3, each of the write gate signals GW1 to GWn may have an active level only during the corresponding horizontal period, and have a non-active level during the remaining horizontal periods of the data write period P3 excluding the corresponding horizontal period.

The data voltages Vdt of the data write period P3 may include multiple data voltages. The data voltages Vdt1, Vdt2, ..., Vdtn−1, and Vdtn may include a first data voltage Vdt1 applied to the data line DL in the first horizontal period H1, a second data voltage Vdt2 applied to the data line DL in the second horizontal period H2, a third data voltage Vdt3 applied to the data line DL in the third horizontal period H3, ..., an n−1-th data voltage Vdtn−1 applied to the data line DL in the n−1-th horizontal period Hn−1, and an n-th data voltage Vdtn applied to the data line DL in the n-th horizontal period Hn.

In the first horizontal period H1, the first write gate signal GW1 may have the active level, and the first data voltage Vdt1 may be applied to the data line DL. In the second horizontal period H2, the second write gate signal GW2 may have the active level, and the second data voltage Vdt2 may be applied to the data line DL. In the third horizontal period H3, the third write gate signal GW3 may have the active level, and the third data voltage Vdt3 may be applied to the data line DL. In the n−1-th horizontal period Hn−1, the n−1-th write gate signal GWn−1 may have the active level, and the n−1-th data voltage Vdtn−1 may be applied to the data line DL. In the n-th horizontal period Hn, the n-th write gate signal GWn may have the active level, and the n-th data voltage Vdtn may be applied to the data line DL.

An operation of the display device 10 according to an embodiment will be described with reference to FIGS. 6 to 9. In FIGS. 6 to 9, transistors surrounded by dotted circles may be transistors in a turn-on state, while transistors other than the transistors surrounded by the dotted circles may be transistors in a turn-off state.

First, an operation of the display device 10 in an initialization period P1 will be described with reference to FIGS. 4 and 6.

Figure 6:
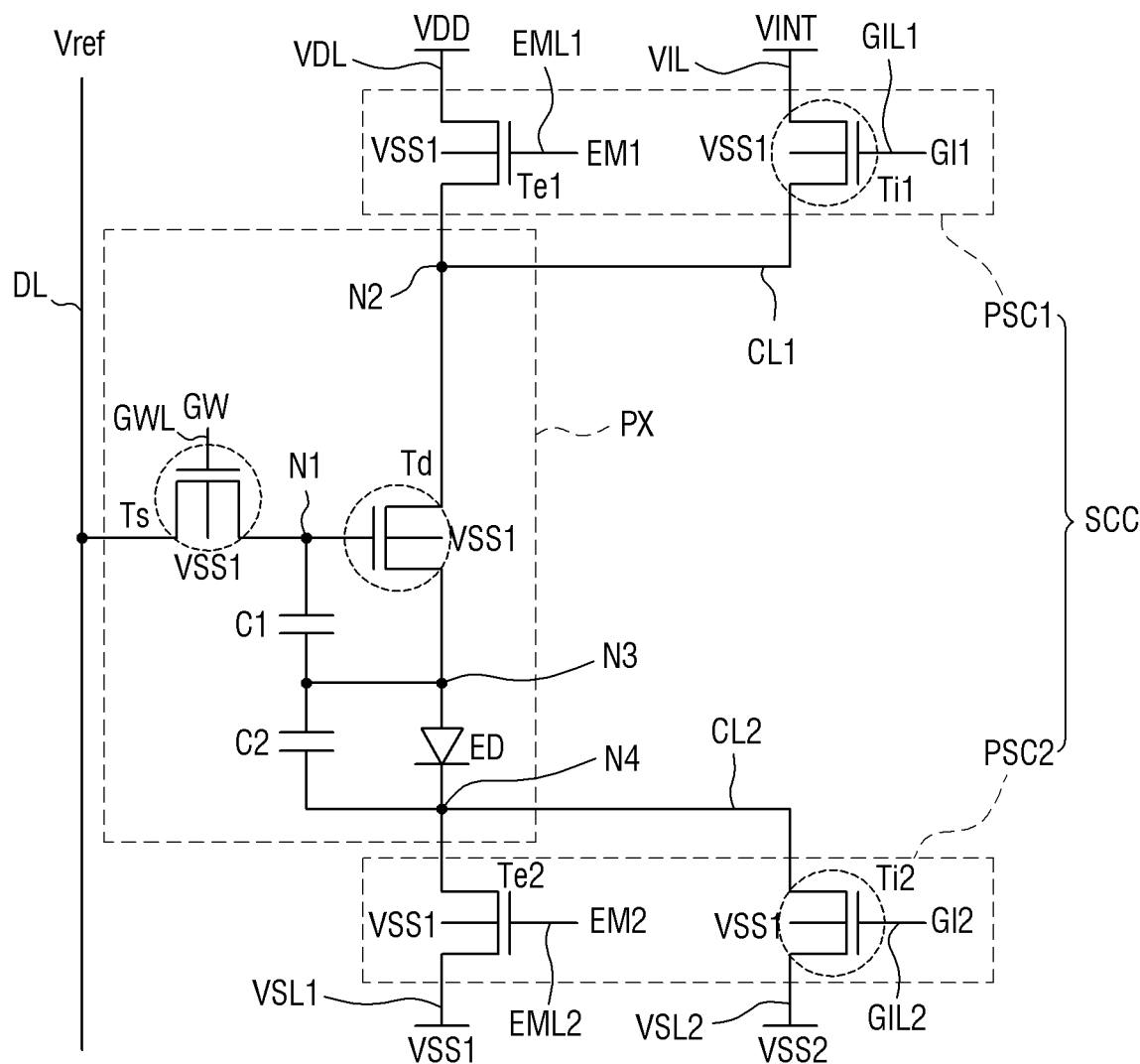
FIG. 6 is a schematic diagram for describing an operation of the display device of FIG. 3 in an initialization period of FIG. 4.

FIG. 6 is a schematic diagram for describing an operation of the display device 10 of FIG. 3 in an initialization period P1 of FIG. 4.

As illustrated in FIG. 4, in the initialization period P1, the first initialization gate signal GI1, the second initialization gate signal GI2, and the write gate signal GW may each have the active level, and the first emission signal EM1 and the second emission signal EM2 may each have the non-active level. In the initialization period P1, the reference voltage Vref may be applied to the data line DL.

The first initialization gate signal GI1 of the active level may be applied to the gate electrode of the first initialization transistor Ti1 through the first initialization gate line GIL1. Accordingly, the first initialization transistor Ti1 may be turned on.

The second initialization gate signal GI2 of the active level may be applied to the gate electrode of the second initialization transistor Ti2 through the second initialization gate line GIL2. Accordingly, the second initialization transistor Ti2 may be turned on.

The write gate signal GW of the active level may be applied to the gate electrode of the switching transistor Ts through the write gate line GWL. Accordingly, the switching transistor Ts may be turned on.

The first emission signal EM1 of the non-active level may be applied to the gate electrode of the first emission control transistor Te1 through the first emission line EML1. Accordingly, the first emission control transistor Te1 may be turned off.

The second emission signal EM2 of the non-active level may be applied to the gate electrode of the second emission control transistor Te2 through the second emission line EML2. Accordingly, the second emission control transistor Te2 may be turned off.

The switching transistor Ts described may be turned on in the initialization period P1, and accordingly, the driving transistor Td may also be turned on. For example, the reference voltage Vref from the data line DL may be applied to the gate electrode of the driving transistor Td through the turned-on switching transistor Ts. Such a reference voltage Vref may be higher than the initialization voltage VINT applied to the drain electrode (substantially the source electrode) of the driving transistor Td, and thus, the driving transistor Td may be turned on. Through the turned-on driving transistor Td, the source electrode (actually the drain electrode) of the driving transistor Td may have a value corresponding to the initialization voltage VINT.

The above-described switching transistor Ts, first initialization transistor Ti1, second initialization transistor Ti2, and driving transistor Td may each be turned on in the initialization period P1, and accordingly, the gate electrode of the driving transistor Td (e.g., the first node N1), the drain electrode of the driving transistor Td (e.g., the second node N2), and the source electrode of the driving transistor Td (e.g., the third node N3) may each be initialized. For example, the reference voltage Vref from the data line DL may be applied to the first node N1, which is electrically connected to the gate electrode of the driving transistor Td, through the turned-on switching transistor Ts. The initialization voltage VINT from the initialization voltage line VIL may be applied to the second node N2, which is electrically connected to the drain electrode of the driving transistor Td, through the turned-on first initialization transistor Ti1. The initialization voltage VINT from the initialization voltage line VIL may be applied to the third node N3, which is electrically connected to the source electrode of the driving transistor Td, through the turned-on first initialization transistor Ti1 and the turned-on driving transistor Td. Accordingly, respective voltages of the gate electrode of the driving transistor Td, the drain electrode of the driving transistor Td, and the source electrode of the driving transistor Td may be initialized. For example, the gate electrode of the driving transistor Td may be initialized by the reference voltage Vref, and the drain electrode and the source electrode of the driving transistor Td may each be initialized by the initialization voltage VINT. The second common voltage VSS2 may be applied to the fourth node N4, which is electrically connected to the second electrode (e.g., the cathode electrode) of the light emitting element ED, through the turned-on second initialization transistor Ti2. Accordingly, the second electrode of the light emitting element ED may be initialized by the second common voltage VSS2. The second common voltage VSS2 may be higher than the initialization voltage VINT, and thus, the light emitting element ED may be biased in a reverse direction in the initialization period P1. In other words, the initialization voltage VINT applied to the third node N3, which is electrically connected to the first electrode of the light emitting element ED, may be lower than or equal to the second common voltage VSS2 applied to the fourth node N4, which is electrically connected to the second electrode of the light emitting element ED, and thus, the light emitting element ED may be biased in the reverse direction in the initialization period P1. Therefore, the light emitting element ED may be maintained in a turn-off state in the initialization period P1.

An operation of the display device 10 in a threshold voltage detection period P2 will be described with reference to FIGS. 4 and 7.

Figure 7:
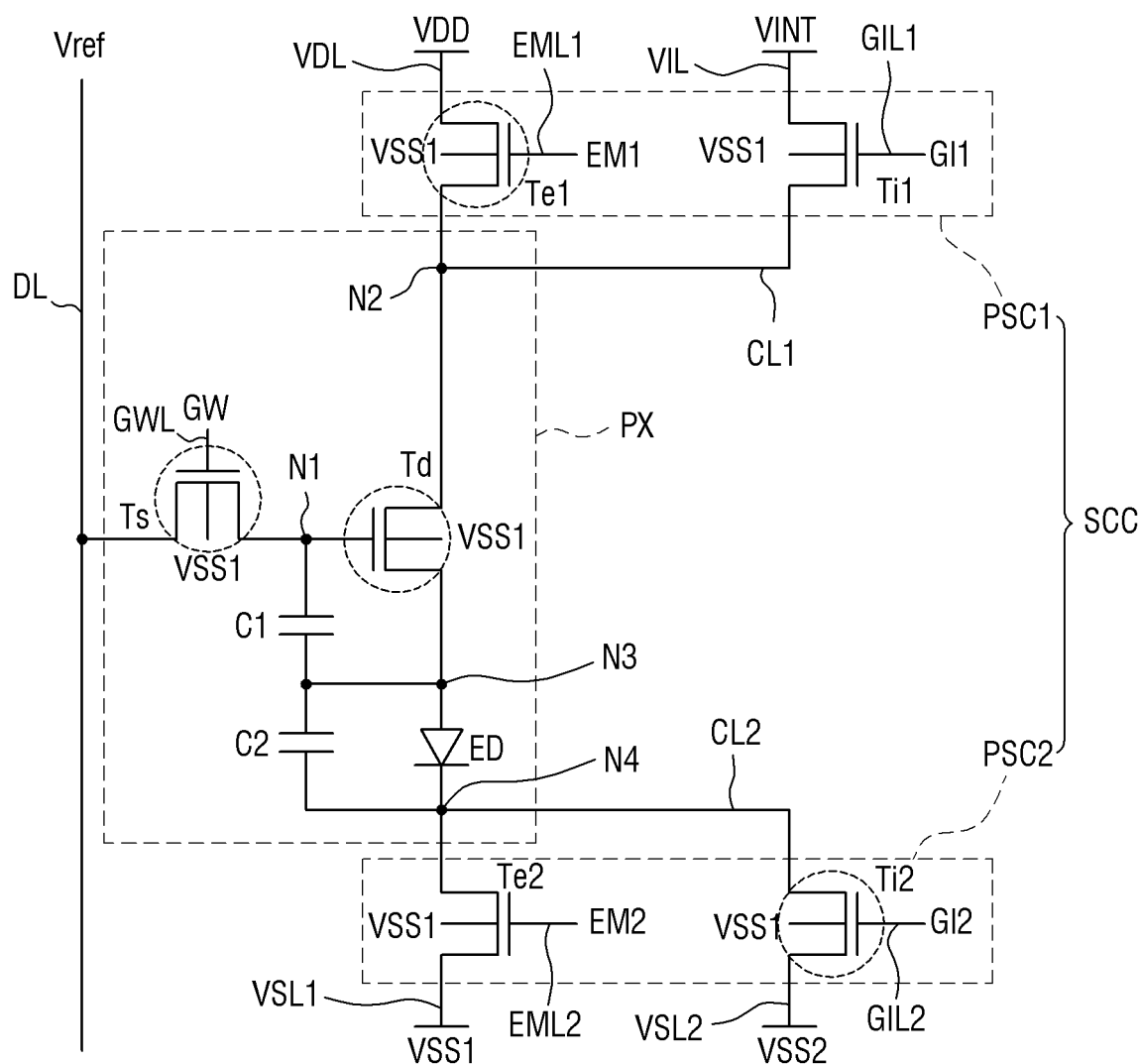
FIG. 7 is a schematic diagram for describing an operation of the display device of FIG. 3 in a threshold voltage detection period of FIG. 4.

FIG. 7 is a schematic diagram for describing an operation of the display device 10 of FIG. 3 in a threshold voltage detection period P2 of FIG. 4.

As illustrated in FIG. 4, in the threshold voltage detection period P2, the first emission signal EM1, the second initialization gate signal GI2, and the write gate signal GW may each have the active level, and the first initialization gate signal GI1 and the second emission signal EM2 may each have the non-active level. In the threshold voltage detection period P2, the reference voltage Vref may be applied to the data line DL.

The first emission signal EM1 of the active level may be applied to the gate electrode of the first emission control transistor Te1 through the first emission line EML1. Accordingly, the first emission control transistor Te1 may be turned on.

The second initialization gate signal GI2 of the active level may be applied to the gate electrode of the second initialization transistor Ti2 through the second initialization gate line GIL2. Accordingly, the second initialization transistor Ti2 may be turned on.

The write gate signal GW of the active level may be applied to the gate electrode of the switching transistor Ts through the write gate line GWL. Accordingly, the switching transistor Ts may be turned on. The reference voltage Vref may be applied to the first node N1 through the turned-on switching transistor Ts and the third node N3 may be maintained at the initialization voltage VINT applied in the previous period P1, and thus, the driving transistor Td may be turned on. In other words, the reference voltage Vref applied to the gate electrode (e.g., the first node N1) of the driving transistor Td may be higher than the initialization voltage VINT applied to the source electrode of the driving transistor Td (e.g., the third node N3), and thus, the driving transistor Td, which is an N-type transistor, may be turned on.

The first initialization gate signal GI1 of the non-active level may be applied to the gate electrode of the first initialization transistor Ti1 through the first initialization gate line GIL1. Accordingly, the first initialization transistor Ti1 may be turned off.

The second emission signal EM2 of the non-active level may be applied to the gate electrode of the second emission control transistor Te2 through the second emission line EML2. Accordingly, the second emission control transistor Te2 may be turned off.

As described above, the reference voltage Vref applied to the gate electrode of the driving transistor Td may be higher than the initialization voltage VINT applied to the source electrode of the driving transistor Td, and may be lower than the driving voltage VDD applied to the drain electrode of the driving transistor Td. Accordingly, the driving transistor Td may be turned on, and a current may flow from the second node N2 toward the third node N3 through the turned-on driving transistor Td, and accordingly, a voltage of the third node N3 may start to increase. In other words, a voltage of the source electrode of the driving transistor Td may start to increase. The moment the voltage of the source electrode of the driving transistor Td increases, such that a gate-source voltage of the driving transistor Td becomes equal to the threshold voltage of the driving transistor Td, the driving transistor Td may be turned off. In case that the driving transistor Td is turned off, the threshold voltage of the driving transistor Td may be maintained by the first capacitor C1. In other words, in the threshold voltage detection period P2, a voltage of the first node N1, which is electrically connected to the first electrode of the first capacitor C1, may have a value corresponding to the reference voltage Vref, and the voltage of the third node N3, which is electrically connected to the second electrode of the first capacitor C1, may have a value corresponding to a voltage obtained by subtracting the threshold voltage of the driving transistor Td from the reference voltage Vref. Accordingly, a voltage across the first capacitor C1 may have a value corresponding to the threshold voltage of the driving transistor Td. Accordingly, at a time the driving transistor Td is turned off, the threshold voltage Vth of the driving transistor Td may be stored in the first capacitor C1.

As such, during the threshold voltage detection period P2, the threshold voltage Vth of the driving transistor Td may be detected and maintained by the first capacitor C1.

The light emitting element ED may be biased in the reverse direction in the threshold voltage detection period P2, and may thus be maintained in the turn-off state in the threshold voltage detection period P2.

An operation of the display device 10 in a data write period P3 will be described with reference to FIGS. 4 and 8.

Figure 8:
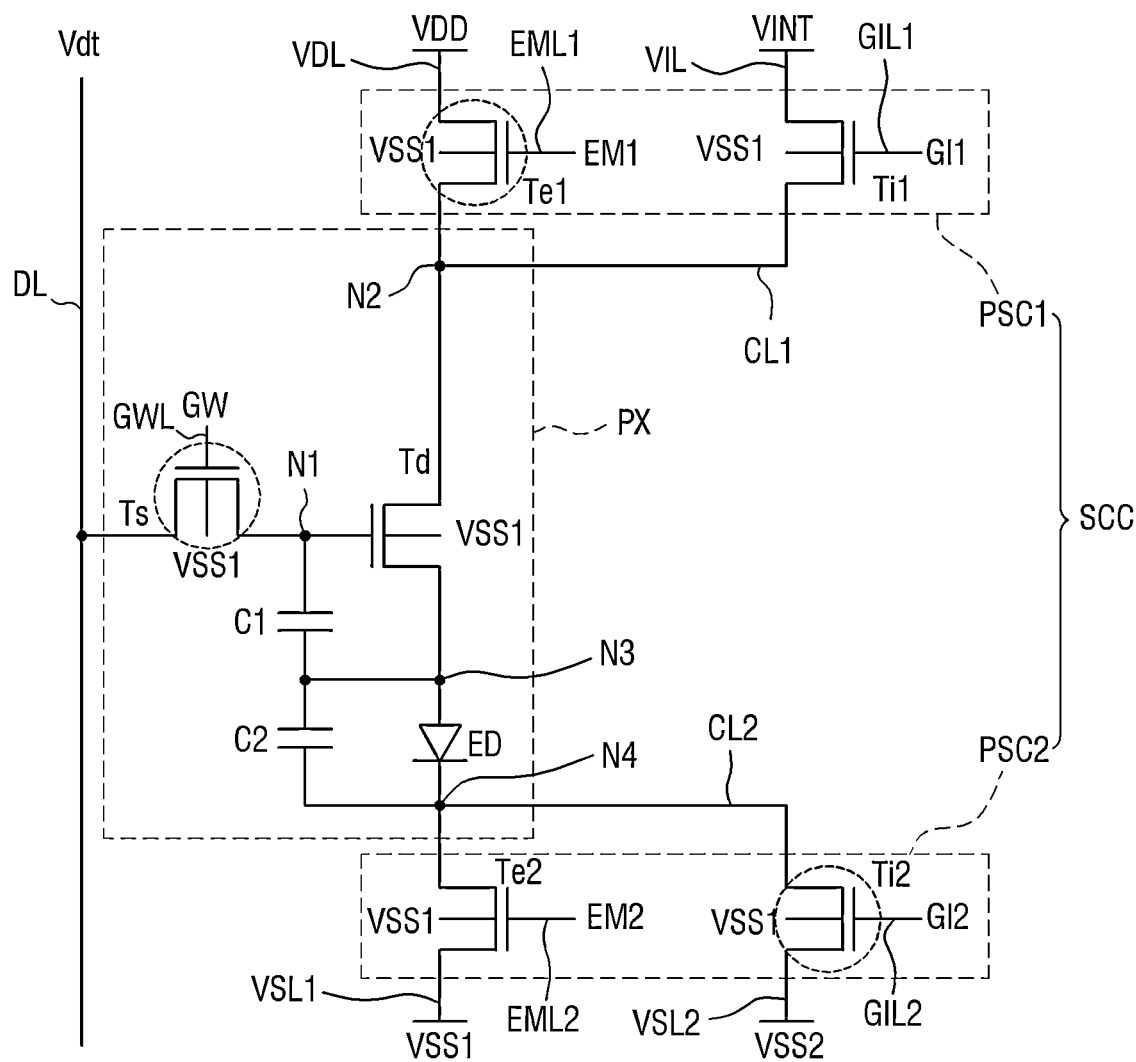
FIG. 8 is a schematic diagram for describing an operation of the display device of FIG. 3 in the data write period of FIG. 4.

FIG. 8 is a schematic diagram for describing an operation of the display device 10 of FIG. 3 in a data write period P3 of FIG. 4.

As illustrated in FIG. 4, in the data write period P3, the first emission signal EM1 and the second initialization gate signal GI2 may each have the active level, and the first initialization gate signal GI1 and the second emission signal EM2 may each have the non-active level. The write gate signal GW may have the active level during a partial period (e.g., one horizontal period) of the data write period P3. The write gate signal GW may have the non-active level during the remaining period of the data write period P3 excluding one horizontal period of the data write period P3. In the data write period P3, the data voltage Vdt may be applied to the data line DL. The data voltage Vdt may be a voltage corresponding to a specific gradation (or luminance) for displaying an image.

The first emission signal EM1 of the active level may be applied to the gate electrode of the first emission control transistor Te1 through the first emission line EML1. Accordingly, the first emission control transistor Te1 may be turned on.

The second initialization gate signal GI2 of the active level may be applied to the gate electrode of the second initialization transistor Ti2 through the second initialization gate line GIL2. Accordingly, the second initialization transistor Ti2 may be turned on.

The write gate signal GW of the active level may be applied to the gate electrode of the switching transistor Ts through the write gate line GWL. Accordingly, the switching transistor Ts may be turned on.

The first initialization gate signal GI1 of the non-active level may be applied to the gate electrode of the first initialization transistor Ti1 through the first initialization gate line GIL1. Accordingly, the first initialization transistor Ti1 may be turned off.

The second emission signal EM2 of the non-active level may be applied to the gate electrode of the second emission control transistor Te2 through the second emission line EML2. Accordingly, the second emission control transistor Te2 may be turned off.

As illustrated in FIG. 8, the data voltage Vdt may be applied to the first node N1 through the data line DL and the turned-on switching transistor Ts. In case that the driving transistor Td in a turn-off state in the previous period P3 is maintained in the turn-off state in the present data write period P3, the third node N3 may be maintained in a floating state. For example, the driving transistor Td may be in a state in which it is weakly turned on in the data write period P3. Nevertheless, the third node N3 may be maintained in a state that is almost close to floating.

The third node N3 may be maintained in the floating state, and accordingly, the voltage of the third node N3 may further increase by a voltage (e.g., the data voltage Vdt) coupled by the first capacitor C1. For example, a magnitude of the data voltage Vdt added to the voltage of the third node N3 may be determined by a ratio between capacitance of the first capacitor C1 and capacitance of the second capacitor C2. For example, the voltage added to the third node N3 may have a value corresponding to "data voltage Vdt*(capacitance of C1/(capacitance of C1+capacitance of C2))". Accordingly, in the data write period P3, the voltage of the first node N1 may have a value corresponding to the data voltage Vdt, a voltage of the second node N2 may have a value corresponding to the driving voltage VDD, and the voltage of the third node N3 may have a value corresponding to "Vref−Vth+Vdat*{capacitance of C1/(capacitance of C1+capacitance of C2)}". Vth may be the threshold voltage of the driving transistor Td.

As such, the data voltage Vdt may be divided by the first capacitor C1 and the second capacitor C2, and thus, a range (e.g., a gradation expression range) of the data voltage Vdt may be expanded. Accordingly, fine gradation expression may be possible, such that image quality of the display device 10 may be improved. In an embodiment, the capacitance of the first capacitor C1 and the capacitance of the second capacitor C2 may be the same. However, the disclosure is not limited thereto, and the capacitance of the second capacitor C2 may be greater than the capacitance of the first capacitor C1. For example, a ratio between the capacitance of the second capacitor C2 and the capacitance of the first capacitor C1 may be about 2:1.

In such a data write period P3, a voltage difference (e.g., the gate-source voltage) between the first node N1, which is the gate electrode of the driving transistor Td, and the source electrode of the driving transistor Td may be maintained by the capacitor C1. Such a gate-source voltage may include the threshold voltage Vth of the driving transistor Td as well as the data voltage Vdt.

The light emitting element ED may be biased in the reverse direction in the data write period P3, and may thus be maintained in the turn-off state in the data write period P3.

An operation of the display device 10 in an emission period P4 will be described with reference to FIGS. 4 and 9.

Figure 9:
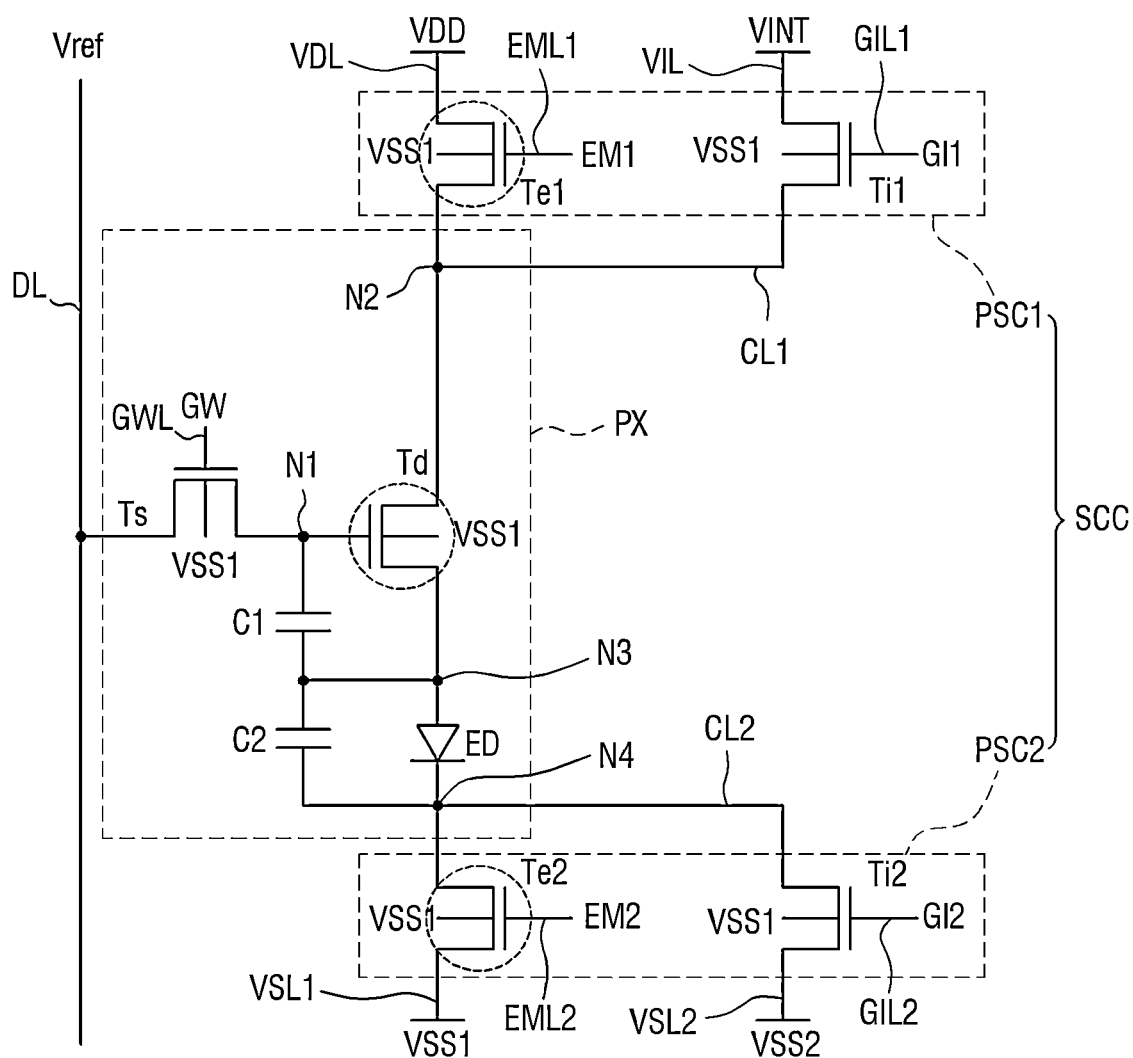
FIG. 9 is a schematic diagram for describing an operation of the display device of FIG. 3 in an emission period of FIG. 4.

FIG. 9 is a schematic diagram for describing an operation of the display device 10 of FIG. 3 in an emission period P4 of FIG. 4.

As illustrated in FIG. 4, in the emission period P4, the first emission signal EM1 and the second emission signal EM2 may each have the active level, and the first initialization gate signal GI1, the second initialization gate signal GI2, and the write gate signal GW may each have the non-active level. In the emission period P4, the reference voltage Vref may be applied to the data line DL.

The first emission signal EM1 of the active level may be applied to the gate electrode of the first emission control transistor Te1 through the first emission line EML1. Accordingly, the first emission control transistor Te1 may be turned on.

The second emission signal EM2 of the active level may be applied to the gate electrode of the second emission control transistor Te2 through the second emission line EML2. Accordingly, the second emission control transistor Te2 may be turned on.

The first initialization gate signal GI1 of the non-active level may be applied to the gate electrode of the first initialization transistor Ti1 through the first initialization gate line GIL1. Accordingly, the first initialization transistor Ti1 may be turned off.

The second initialization gate signal GI2 of the non-active level may be applied to the gate electrode of the second initialization transistor Ti2 through the second initialization gate line GIL2. Accordingly, the second initialization transistor Ti2 may be turned off.

The write gate signal GW of the non-active level may be applied to the gate electrode of the switching transistor Ts through the write gate line GWL. Accordingly, the switching transistor Ts may be turned off.

In the emission period P4, the driving transistor Td may be maintained in a turn-on state by the gate-source voltage maintained by the first capacitor C1.

In the emission period P4, the voltage of the first node N1 may have a value corresponding to, for example, "Vdt+VEL−Vref+Vth−Δ". VEL may be a voltage of the first electrode of the light emitting element ED (e.g., the third node N3) in the emission period P4, and Δ may have the value corresponding to "Vref−Vth+Vdat*{capacitance of C1/(capacitance of C1+capacitance of C2)}" described above.

As such, in the emission period P4, the driving transistor Td, the first emission control transistor Te1, and the second emission control transistor Te2 may be turned on, and accordingly, the driving voltage VDD may be applied to the first electrode of the light emitting element ED (e.g., N3) through the turned-on driving transistor Td, first emission control transistor Te1, and second emission control transistor Te2 and the first common voltage VSS1 may be applied to the second electrode of the light emitting element ED (e.g., N4) through the turned-on second emission control transistor Te2. The gate-source voltage maintained by the first capacitor C1 may include the threshold voltage Vth of the driving transistor Td, and thus, a magnitude of the driving current flowing to the light emitting element ED through the turned-on driving transistor Td may be determined based on the data voltage Vdt and the threshold voltage Vth of the driving transistor Td. Accordingly, the driving current supplied to the light emitting element ED may accurately reflect the magnitude of the data voltage Vdt. In other words, the driving current described above may have an accurate value in which the threshold voltage Vth of the driving transistor Td is compensated for. As such, the driving currents of the respective pixels PX may be determined in a state in which different values of the threshold voltages Vth of the driving transistors Td of the respective pixels PX are compensated for, and thus, a luminance deviation between the respective pixels PX due to a deviation in the threshold voltage Vth between the driving transistors Td of the respective pixels PX may be minimized. Accordingly, image quality of the display device 10 may be improved.

The threshold voltage detection period P2 and the data write period P3 may be separated from each other, and thus, the data voltage Vdt may be written at a high speed. Accordingly, the display device 10 may be driven at a high speed.

According to an embodiment, all pixels PX may emit light simultaneously in the emission period P4. For example, initialization operations, threshold voltage detection operations, and data write operations of the pixels PX may be performed sequentially in one horizontal line unit, but emission operations of the pixels PX may be performed simultaneously.

Figure 10:
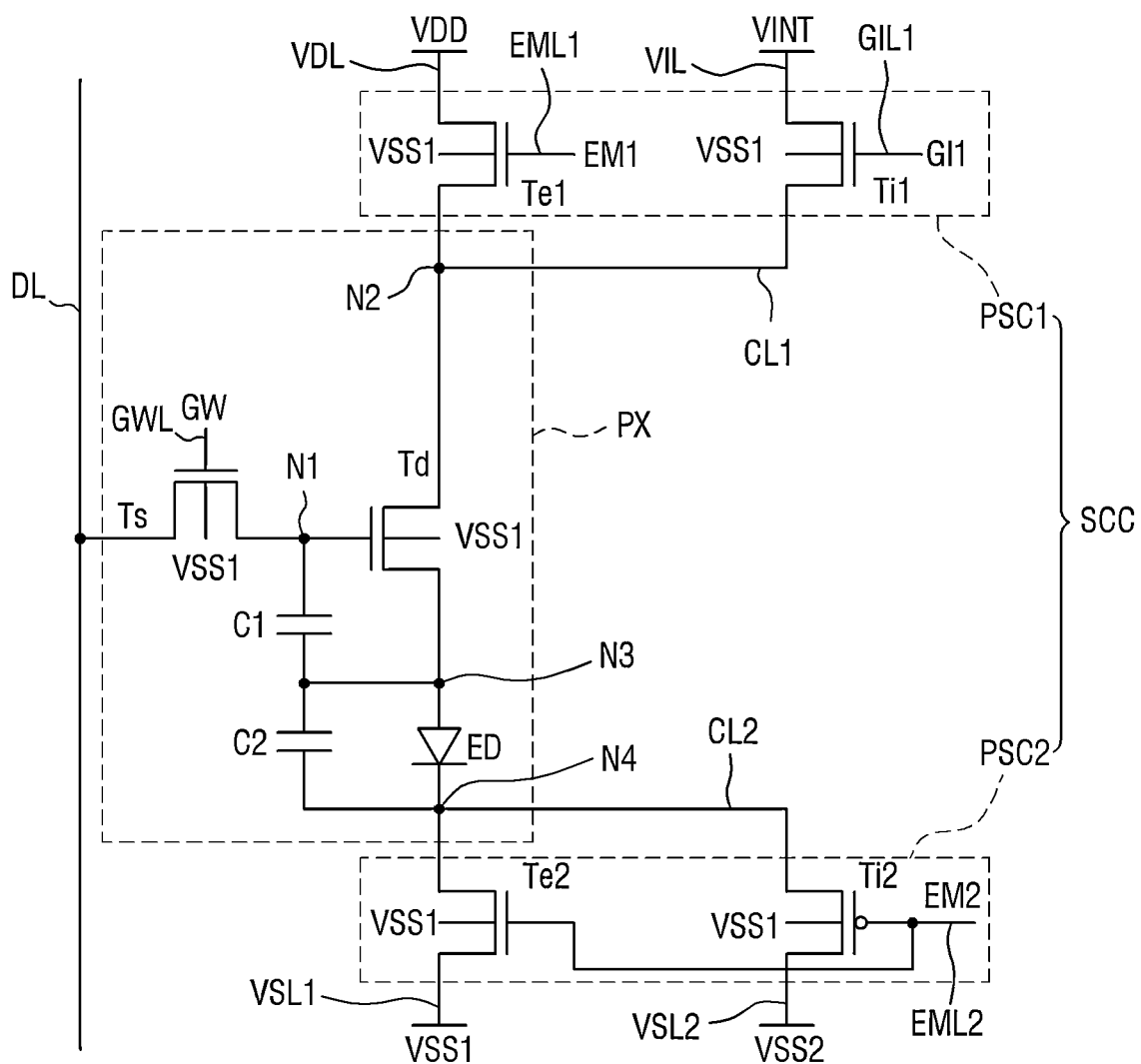
FIG. 10 is a schematic diagram of an equivalent circuit of a pixel of FIG. 2 and a sub-common circuit connected to the pixel.

FIG. 10 is a schematic diagram of an equivalent circuit of a pixel PX of FIG. 2 and a sub-common circuit SCC connected to the pixel PX.

An embodiment of FIG. 10 is different from the embodiment of FIG. 3 described above in a configuration of the second initialization transistor Ti2, and such a difference will be described below.

The second initialization transistor Ti2 of FIG. 10 may be turned on by the second emission signal EM2 from the second emission line EML2 to electrically connect the fourth node N4 and the second common voltage line VSL2 to each other. A gate electrode of the second initialization transistor Ti2 may be electrically connected to the second emission line EML2, a drain electrode of the second initialization transistor Ti2 may be electrically connected to the fourth node N4, a source electrode of the second initialization transistor Ti2 may be electrically connected to the second common voltage line VSL2, and a body electrode of the second initialization transistor Ti2 may be electrically connected to the first common voltage line VSL1.

The second initialization transistor Ti2 of FIG. 10 may be an opposite type of transistor to the second emission control transistor Te2. For example, in case that the second emission control transistor Te2 is an N-type transistor, the second initialization transistor Ti2 may be a P-type transistor. In case that the second initialization transistor Ti2 is the P-type transistor, the second emission signal EM2 may be applied to the gate electrode of the second initialization transistor Ti2. This is because, as illustrated in FIG. 4, the second initialization gate signal GI2 has a shape in which a phase thereof is inverted by 180° with respect to a phase of the second emission signal EM2. Accordingly, in case that the second emission control transistor Te2 and the second initialization transistor Ti2 are opposite types of transistors, the second emission control transistor Te2 and the second initialization transistor Ti2 may be controlled by the same signal (e.g., the second emission signal EM2). In such a case, the second initialization gate signal GI2 and the second initialization gate line GIL2 for transmitting the second initialization gate signal GI2 may be omitted, and a configuration of the circuit may be simplified.

Although not illustrated, the first initialization transistor Ti1 may be an opposite type of transistor to the first emission control transistor Te1. For example, in case that the first emission control transistor Te1 is an N-type transistor, the first initialization transistor Ti1 may be a P-type transistor. In case that the first initialization transistor Ti1 is the P-type transistor, the first emission signal EM1 may be applied to the gate electrode of the first initialization transistor Ti1. This is because, as illustrated in FIG. 4, the first initialization gate signal GI1 has a shape in which a phase thereof is inverted by 180° with respect to a phase of the first emission signal EM1. Accordingly, in case that the first emission control transistor Te1 and the first initialization transistor Ti1 are opposite types of transistors, the first emission control transistor Te1 and the first initialization transistor Ti1 may be controlled by the same signal (e.g., the first emission signal EM1).

For example, the display device 10 of FIG. 10 may operate based on the timing chart of FIG. 4. However, as described above, at least one of the first initialization gate signal GI1 and the second initialization gate signal GI2 of FIG. 4 may be omitted.

Figure 11:
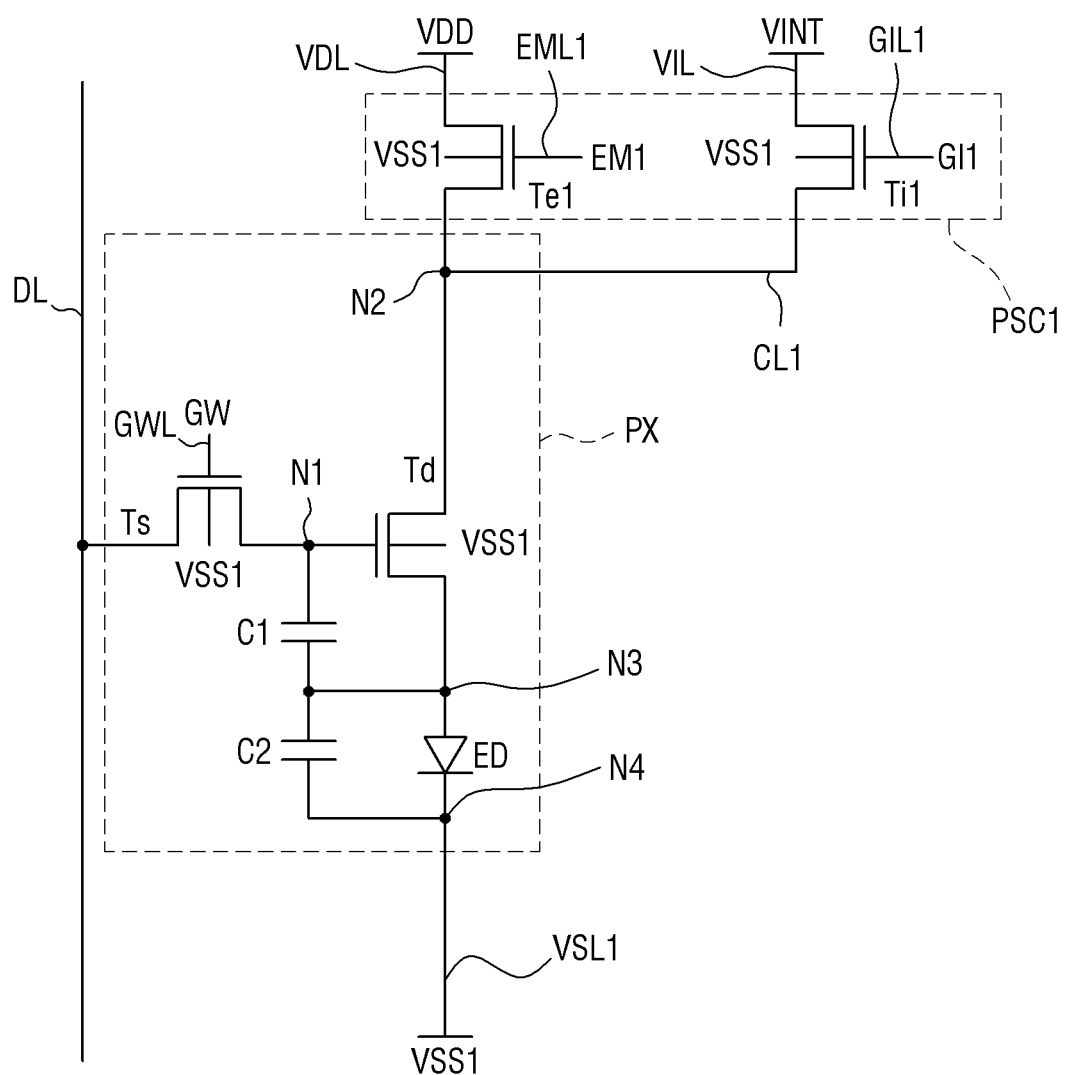
FIG. 11 is a schematic diagram of an equivalent circuit of a pixel of FIG. 2 and a sub-common circuit connected to the pixel.

FIG. 11 is a schematic diagram of an equivalent circuit of a pixel PX of FIG. 2 and a sub-common circuit SCC connected to the pixel PX.

An embodiment of FIG. 11 is different from the embodiment of FIG. 3 described above in that it does not include the second power switching circuit PSC2, and such a difference will be described below.

As illustrated in FIG. 11, the second electrode of the light emitting element ED (e.g., the fourth node N4) may be connected (e.g., directly connected) to the first common voltage line VSL1. For example, in case that a threshold voltage of the light emitting element ED is sufficiently high, the second electrode of the light emitting element ED may be connected (e.g., directly connected) to the first common voltage line VSL1 without the second power switching circuit PSC2 described above. In case that the threshold voltage of the light emitting element ED is sufficiently high, the light emitting element ED may not emit light in the above-described initialization period P1, threshold voltage detection period P2, and data write period P3. According to an embodiment of FIG. 11, the second power switching circuit PSC2, the second common voltage, and the second common voltage line VSL2 may be omitted, and thus, the circuit may be further simplified.

For example, the display device 10 of FIG. 11 may operate based on the timing chart of FIG. 4. However, the second initialization gate signal GI2 and the second emission signal EM2 of FIG. 4 may be omitted.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
    a display panel having a display area and a non-display area;
    a plurality of pixels disposed in the display area;
    a light emitting element disposed in each of the plurality of pixels;
    a driving transistor disposed in each of the plurality of pixels and electrically connected to the light emitting element; and
    a common circuit disposed in the non-display area and electrically connected to at least one of the driving transistor and the light emitting element of each of the plurality of pixels, the common circuit including transistors usable to control current to the driving transistor and the light emitting element.

2. The display device of claim 1, wherein the common circuit is electrically connected to at least one of a drain electrode of the driving transistor and a cathode electrode of the light emitting element.

3. The display device of claim 1, wherein the common circuit includes a first power switching circuit electrically connected to a drain electrode of the driving transistor and receiving a driving voltage, an initialization voltage, a first emission signal, and a first initialization gate signal.

4. The display device of claim 3, wherein the first power switching circuit includes:
    a first emission transistor electrically connected between the drain electrode of the driving transistor and a driving voltage line transmitting the driving voltage; and
    a first initialization transistor electrically connected between the drain electrode of the driving transistor and an initialization voltage line transmitting the initialization voltage.

5. The display device of claim 4, wherein
    the first emission signal is input to a gate electrode of the first emission transistor, and
    the first initialization gate signal is input to a gate electrode of the first initialization transistor.

6. The display device of claim 5, wherein the common circuit further includes a second power switching circuit electrically connected to a cathode electrode of the light emitting element and receiving a first common voltage, a second common voltage, and at least one of a second emission signal and a second initialization gate signal.

7. The display device of claim 6, wherein the second power switching circuit includes:
    a second emission transistor electrically connected between the cathode electrode of the light emitting element and a first common voltage line transmitting the first common voltage; and
    a second initialization transistor electrically connected between the cathode electrode of the light emitting element and a second common voltage line transmitting the second common voltage.

8. The display device of claim 7, wherein
    the second emission signal is input to a gate electrode of the second emission transistor, and
    the second initialization gate signal is input to a gate electrode of the second initialization transistor.

9. The display device of claim 8, wherein each of the plurality of pixels includes a switching transistor electrically connected between a data line and a gate electrode of the driving transistor.

10. The display device of claim 9, wherein a write gate signal is input to a gate electrode of the switching transistor.

11. The display device of claim 10, further comprising:
    a gate driver transmitting the first emission signal, the second emission signal, the first initialization gate signal, and the second initialization gate signal to the common circuit and transmitting the write gate signal to each of the plurality of pixels.

12. The display device of claim 11, wherein in an initialization period,
    the first initialization gate signal, the second initialization gate signal, and the write gate signal each have an active level,
    the first emission signal and the second emission signal each have a non-active level, and
    a reference voltage is applied to the data line.

13. The display device of claim 12, wherein in a threshold voltage detection period after the initialization period, the first emission signal, the second initialization gate signal, and the write gate signal each have an active level, the first initialization gate signal and the second emission signal each have a non-active level, and the reference voltage is applied to the data line.

14. The display device of claim 13, wherein in a data write period after the threshold voltage detection period, the first emission signal and the second initialization gate signal each have an active level, the first initialization gate signal and the second emission signal each have a non-active level, and a data voltage is applied to the data line.

15. The display device of claim 14, wherein the write gate signal has an active level during a partial period of the data write period.

16. The display device of claim 15, wherein in an emission period after the data write period, the first emission signal and the second emission signal each have an active level, the first initialization gate signal, the second initialization gate signal, and the write gate signal each have a non-active level, and the reference voltage is applied to the data line.

17. The display device of claim 16, wherein each of the reference voltage, the initialization voltage, the first common voltage, and the second common voltage is a direct current (DC) voltage.

18. The display device of claim 17, wherein the initialization voltage is lower than or equal to the second common voltage, the initialization voltage is lower than the reference voltage, the reference voltage is higher than the first common voltage, the reference voltage is higher than a sum of the initialization voltage and a threshold voltage of the driving transistor, the reference voltage is higher than the first common voltage and lower than the driving voltage, and the driving voltage is higher than a sum of the reference voltage and the threshold voltage of the driving transistor.

19. The display device of claim 9, wherein each of the plurality of pixels further includes:

a first capacitor electrically connected between the gate electrode of the driving transistor and an anode electrode of the light emitting element; and a second capacitor electrically connected between the anode electrode of the light emitting element and the cathode electrode of the light emitting element.

20. The display device of claim 19, wherein a ratio between capacitance of the second capacitor and capacitance of the first capacitor is about 2:1.

21. The display device of claim 7, wherein the second emission transistor and the second initialization transistor are opposite types of transistors.

22. The display device of claim 21, wherein the second emission signal is input to a gate electrode of the second emission transistor and a gate electrode of the second initialization transistor.

23. The display device of claim 1, wherein the common circuit includes a first power switching circuit electrically connected to a drain electrode of the driving transistor and receiving a driving voltage, an initialization voltage, a first emission signal, and a first initialization gate signal, and a cathode electrode of the light emitting element is directly connected to a first common voltage line transmitting a first common voltage.

* * * * *